United States Patent [19]

Kawai

[11] Patent Number: 4,912,398
[45] Date of Patent: Mar. 27, 1990

[54] MOVING IRON INSTRUMENT

[76] Inventor: Yuji Kawai, 9-32-2 Nakacho, Musashino-shi, Tokyo, Japan

[21] Appl. No.: 322,150

[22] Filed: Mar. 10, 1989

[30] Foreign Application Priority Data

| Apr. 21, 1988 | [JP] | Japan | 63-99251 |
| Apr. 28, 1988 | [JP] | Japan | 63-57709[U] |
| May 10, 1988 | [JP] | Japan | 63-61263[U] |
| May 20, 1988 | [JP] | Japan | 63-66420[U] |

[51] Int. Cl.$^4$ ............................................. G01R 1/20
[52] U.S. Cl. ................................................... 324/147
[58] Field of Search ............... 324/147, 146, 154, 153

[56] References Cited

U.S. PATENT DOCUMENTS

| 2,183,685 | 12/1939 | Lingg | 324/147 |
| 2,610,989 | 9/1952 | Wiese et al. | 324/147 |
| 2,998,571 | 8/1961 | Corson et al. | 324/147 |
| 3,034,058 | 5/1962 | Bennekom | 324/147 |
| 3,155,904 | 11/1964 | Thanander | 324/147 |
| 3,165,695 | 1/1965 | Roerty | 324/147 |
| 3,585,501 | 6/1971 | Okada | 324/147 |

Primary Examiner—Reinhard J. Eisenzopf
Assistant Examiner—Maura K. Regan
Attorney, Agent, or Firm—Moonray Kojima

[57] ABSTRACT

A moving iron instrument comprising a cylinder divided into two parts, a cylinder member to which a fixed iron vane is attached, and a frame member for holding a moving shaft to which a moving iron vane is attached, wherein the two members are made of an insulating material.

10 Claims, 6 Drawing Sheets (A)

(B)

(A)

(B)

(A)

(B)

MOVING IRON INSTRUMENT

BACKGROUND OF THE INVENTION

1. Field of Invention

This invention relates to an improved moving-iron instrument, such as an electrical meter.

2. Description of the Prior Art

A conventional moving-iron instrument, such as an electrical meter, comprises a field coil which is used to generate a magnetic field in response to an electric current applied thereto, and the interaction of a fixed iron piece, magnetized by the magnetic field, with a moving iron vane generates a driving torque so that a moving section comprising a pointer is rotated to indicate the quantity being measured.

FIG. 1 is a structural diagram of an important portion of a conventional moving-iron instrument comprising a moving section 1 comprising a moving shaft 1a, a pointer 1b, a damper 1c, a spring 1d, and a pair of moving iron vanes 1e and 1f, attached to shaft 1a; and a bottomed cylinder 2 of cylindrical shape, the side of an open portion being screwed to a frame 3. Cylinder 2 comprises fixed iron vanes 2a, 2b attached to the peripheral surface thereof so as to face opposite moving iron vanes 1e, 1f; a jeweled screw 2c screwed to a bottom part of cylinder 2; and a bearing or pivot (unnumbered) attached to the lower end of moving shaft 1a and coupled to jeweled screw 2c. The upper end of moving shaft 1a has a bearing or pivot (unnumbered) coupled to jeweled screw 2d as shown. An annular field coil 5 surrounds cylinder 2, and a bowl shaped sheild 6 surrounds coil 5.

In the moving instrument, field coil 5 generates a magnetic field in response to an electric current applied thereto. Interaction of fixed iron vanes 2a, 2b, magnetized by the magnetic field, with moving iron vanes 1e, 1f, generates a driving torque. As a result, the moving section 1 is rotated so that the resulting rotational position of moving section 1 can be read by observing the rotational position of the pointer 1b.

The conventional moving iron instrument of FIG. 1, however, has certain drawbacks, such as the following.

1. When the instrument is adjusted for sensitivity, or an extended scale is to be incorporated into the instrument, screws 3a, 3b are loosened and then cylinder 2 is rotated. This requires the rotating of screw 2c which is attached to cylinder 2. That is, even where the gaps between the bearing attached to the ends of moving shaft 12 and jeweled crew 2c, 2d have been once adjusted adequately, when the sensitivity adjustment is to be made or when the extension scale is to be incorporated, jeweled screw 2c, 2d must be loosened and cylinder 2 must be turned. This is time consuming, inefficient and subject to human error.

2. Cylinder 2 is usually made of a metal plate which is formed by a drawing process by a press. Jeweled screw 2c must be attached to the center of the bottom part of cylinder 2. Thus, since cylinder 2 is formed by the drawing process, it is difficult to located the exact center, and lower jeweled screw 2c is liable to deviate from the axial center of moving section 1. An off-center pointer leads to erroneous measurements.

3. Since cylinder 2 is made of metal, eddy currents flow. Consequently, an indication error of about −0.7% arises at 50 to 400 Hz. That is the conventional instrument of FIG. 1 has an inferior frequency characteristic.

SUMMARY OF THE INVENTION

Accordingly, an object of the invention is to overcome the aforementioned and other deficiencies, drawbacks and defects of the prior art.

Another object is to provide a moving-iron apparatus having easily achievable sensitivity adjustment.

A further object is to provide such an apparatus having superior frequency characteristic.

A still further object is to provide such an apparatus which can be readily fabricated by machining techniques with high precision.

A yet further object is to provide such an apparatus which can be produced at low cost, has a small number of parts, and can be easily assembled.

The foregoing and other objects are attained by the invention wherein a cylinder is divided into two parts, a cylinder member to which a fixed iron vane is attached, and a frame member for holding a moving shaft to which a moving iron vane is attached, with both the cylinder member and the frame member being made of an insulating material, such as plastic.

DETAILED DESCRIPTION OF THE PREFERRED EMBODIMENTS

Figure 3:
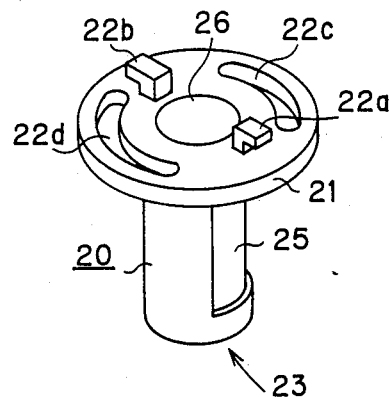
FIGS. 3(A) and 3(B) are exploded perspective views depicting important components of the invention.
Figure 3:
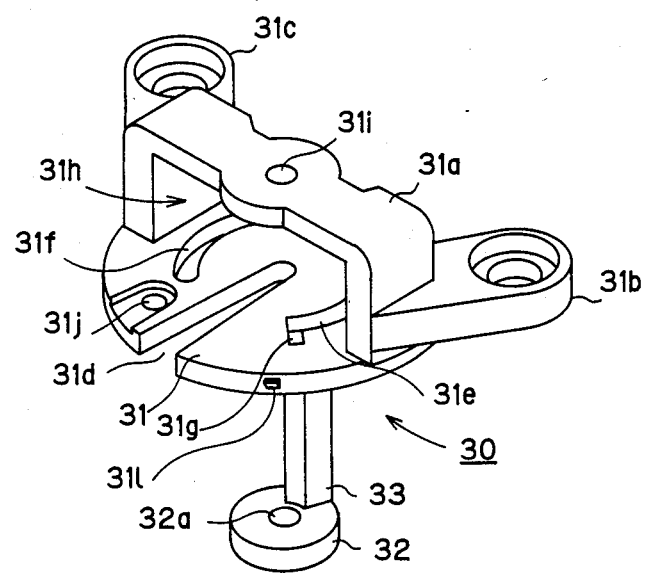
Figure 4:
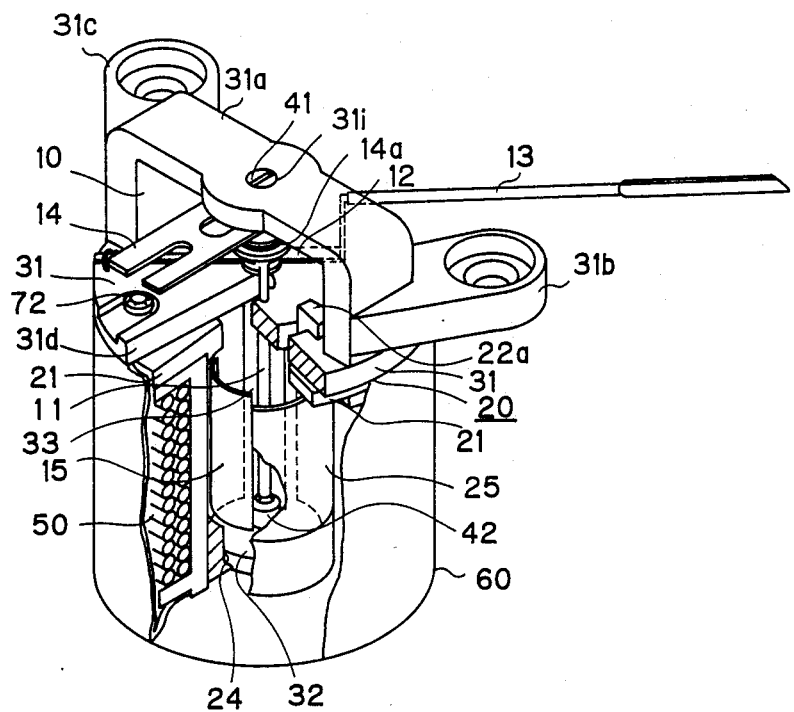
FIGS. 4 is an assembled perspective view of the embodiment of FIGS. 2(A)–2(C).

Turning to FIGS. 2(A)–2(C), 3(A), 3(B) and 4, FIG. 2(A) is a top view; FIG. 2(B) is a side view, partly in cross section, as viewed in the direction of arrow X in FIG. 2(A); FIG. 2(C) is another side view, partly in cross section, as viewed in the direction of arrow Y in FIG. 2(A); FIGS. 3(A), 3(B) are exploded perspective views of portions of the embodiment; and FIG. 4 is a perspective assembled view of the embodiment.

In these figures, there is a depicted a moving-iron instrument, such as an electric meter to measure electrical quantities representing various physical quantities, comprising a moving section 10 comprising a moving shaft 11, a pointer support 12 secured to shaft 11, a pointer 13 (see FIG. 4) attached to support 12, a hair spring 14a attached to a zero adjustment arm 14, and a moving iron vane 15 attached to moving shaft 11.

A cylindrical member 20 (see FIG. 3(A)) has a fixed iron vane 25 attached thereto. Cylinder member 20 has a disk shaped collar 21 provided in an open portion thereof. Collar 21 has L-shaped projecting portions 22a, 22b provided on the upper surface thereof and circular holes 22c, 22d formed therein. A bottom surface 23 has a through hole 24 formed at a central portion thereof. The fixed iron vane 25 is attached to the outer side of the cylindrical portion of cylinder member 20 by bonding or the like. Cylinder member 20 is fabricated from an insulating material, such as plastic, by a machining technique or by precision molding.

A frame 30 (see FIG. 3 (B)) holds a moving shaft 11 to which the moving iron vane 25 is attached. Frame 30 comprises a disk 31, similar in shape to collar 21 of cylinder 20; a small diameter disk 32 coaxial with disk 31, and a stem portion 33 for connecting together disck 32 and disk 31. To assemble the arrangment, disk 32 and stem portion 33 are inserted in and disposed within a cylindrical space 26 of cylinder member 20. At this time, disc 32 is positioned in through hole 24 formed in the central portion of the bottom surface 23 of cylinder 20. The upper side of disk 31 has a bridge 31a and attaching arm portions 31b, 31c provided on both legs of bridge 31a. Disck 31 has a notch 31d reaching the center thereof and a pair of circular holes 31e, 31f extending along a circumference thereof. Each of the paired holes 31e, 31f has an angular hole portion 31g, 31h formed at one end thereof for allowing insertion of the corresponding projecting portions 22a, 22b provided on cylinder member 20. Frame member 30 is assembled for use so that the stem portion 33 is fitted in the cylindrical space of cylinder 20. In this case, projecting portions 22a, 22b provided on cylinder member 20 are inserted through angular hole portions 31g, 31h into holes 31e, 31f formed in disk 31 of frame member 30, and are guided by circular holes 31e, 31f so that cylinder member 20 can rotate within the extent of the length of the paired holes. Bridge 31a and disk 32 have respective screw holes 31i and 32 at central portions thereof to which the jeweled screws 41 and 42 are screwed. As with cylinder member 20, frame member 30 is, for example, made of an insulating material, such as plastic, and formed integrally by for example precision molding.

A cylindrical field coil 50 is provided in a cylindrical shape, of which cylinder member 20 with frame member 30, attached thereto, is inserted. A shield 60 is disposed surrounding field coil 50. The instrument is assembled, for example, in the following manner.

1. Cylinder member 20 is formed by machining a cylindrical body with a collar 21 or by precision molding, and attaching fixed iron vane 25 to the fabricated cylinder member.

Frame member 30 is formed integrally by machining or precision molding disks 31, 32, stem portion 33, and bridge 31, etc; and by attaching, such as by screwing in, jeweled screws 41, 42 to screw holes 31i and 32a of bridge 31a and disk 32 of the formed frame.

2. Moving shaft 11 is inserted in moving section 10. Pointer support 12, spring 14a, moving iron vane 15, etc are attached to the moving shaft 11 through notch 31d formed in disk 31 of frame member 30 into the inside of frame member 30. The bearing or pivot (unnumbered) is attached to each of both ends of moving shaft 11 with the jeweled screws 41, 42 being attached to frame member 30. The gaps between the bearings and jeweled screws are adjusted suitably by regulating screws 41, 42.

3. Frame member 30 is inserted having moving section 10 attached thereto so that stem portion 33 is fitted in cylinder member 20, and is coupled to the paired projecting portions 22a, 22b provided on cylinder member 20 with paired circular holes 31e, 31f formed in disk 31 of frame member 30.

In this case, when the adjustment of sensitivity of the instrument is to be made or when the extended scale is to be incorporated, this can be achieved by regulating the relative position between fixed iron vane 25 attached to cylinder member 20 and moving iron vane 15 attached to moving section 10. For this purpose, it is necessary to rotate cylinder member 20 in relation to frame 30. However, in the instrument, since projecting portions 22a, 22b provided on cylinder member 20 are guided by circular holes 31e, 31f formed in disk 31 of frame member 30, cylinder member 20 can rotate accurately about moving shaft 11.

4. Cylinder member 20, with the frame member 30 attached thereto, is inserted in the cylindrical space of field coil 50 covered with shield 60.

5. The sensitivity and the like of the instrument is adjusted while applying a reference current to field coil 50 to cause the rotating of cylinder member 20 in relation to frame 30. After adjustment, cylinder member 20 and frame member 30 are secured to field coil 50 by fitting screws 71, 72 into holes 31j, 31k (31k is not shown) formed in disk 31 and into circular holes 22c, 22d.

Although the foregoing embodiment has fixed iron vane 25 attached to the outside of cylinder member 20, it may also be secured on the inside of cylinder member 20. In that latter case, the gap between fixed vane 25 and moving vane 15 can be narrowed so that a large driving torgue is produced.

According to the foregoing embodiment:

1. Since the cylinder is divided into two parts, namely, the cylinder member and the frame member, and the moving section is held by the upper and lower jeweled screws attached to the frame member, if the gaps between the bearing and the jeweled screws have once been adjusted in the assembled state of the moving section, no readjustment of the gaps is necessary when the adjustment of sensitivity of the instrument is made or when the scale is extended even after rotating the cylinder.

2. Since the frame to which the moving section is mounted, is fabricated by precision molding, an instrument is produced having accuracy higher than the conventional instrument in which the moving section is mounted to a cylinder fabricated by the drawing process of a press.

3. Since the cylinder member and the frame member are made of an insulating material, such as plastic, the frequency error of the instrument due to eddy currents appearing in a metal body located close the the field coil is reduced to about 0.13 to 0.14%, at 50 to 400 Hz. This results in a frequency error which is one-fifth (1/5) of the conventional instrument frequency error.

Figure 5:
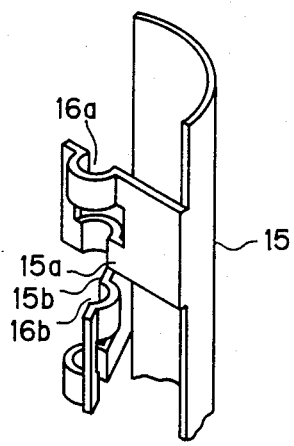
FIGS. 5(A) and 5(B) are diagrams depicting a structure for attaching the moving iron vane of the invention.
Figure 5:
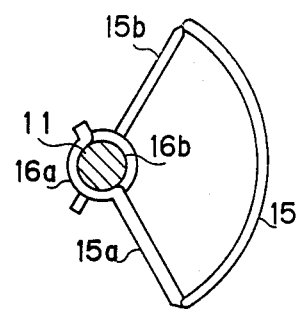

The attaching portion of moving iron vane 15 is shown in greater detail in FIGS. 5(A) and 5(B). In FIG. 5(A), attaching arms 15a, 15b are provided on both edges of arcuate moving iron vane 15 and extend toward an inner central portion. The respective distal ends of attaching arms 15a, 15b have curved portions 16a, 16b about which moving shaft 11, shown in FIG. 2, passes. With moving shaft 11 inserted in the curved portions 16a 16b of attaching arms 15a, 15b, moving vane 15 is attached to moving shaft 11, for example, by bonding or the like, at the position where it faces opposite fixed iron piece 25 attached to cylinder member 20. The attached state is shown in FIG. 5(B).

With the described attaching means of moving from piece 15, since it has two attaching arms which are attached to moving shaft 11, moving iron vane 15 can be attached rigidly to shaft 11 without fluctuation of the attaching dimension.

Figure 6:
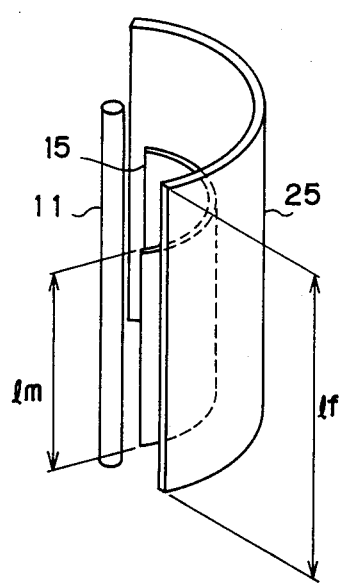
FIG. 6(A) is a diagram depicting the size relationship between the moving iron vane and the fixed iron vane of the invention.
FIG. 6(B) is a graph depicting the sensitivity characteristic.
Figure 6:
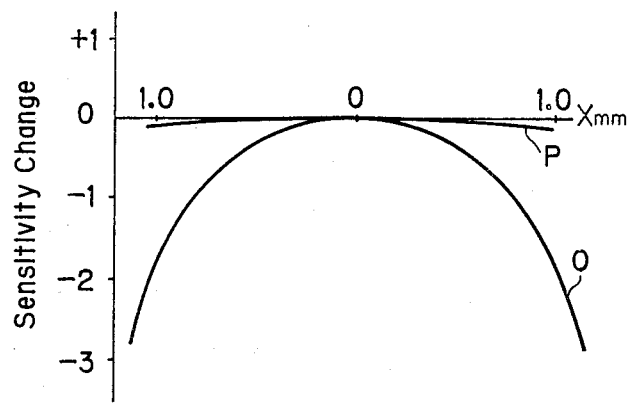

It should be noted that the moving iron vane 15 can be made different in size from the fixed iron vane 25, as shown in FIG. 6(A).

In FIG. 6(A), with moving iron piece 15 having a length lm, the length lf of fixed iron piece 25 is selected so as to meet the condition lm<lf. In this manner, where the two iron vanes are made of different sizes, even when there arises variations in the dimensional relationship between moving vane 15 and fixed vane 25 due to the dimensional error and/or assembly error of the individual components comprising moving section 10, cylinder member 20 and frame 30, the sensitivity change of the instrument is small even under such variations. That is, assuming that moving iron vane 15 and fixed iron vane 25 deviate in relative positions vertically from each other, when the two iron vanes 15, 25 have the same size, the sensitivity change becomes as illustrated by curve 0 in FIG. 6(B). On the other hand, when moving iron vane 15 and fixed iron vane 25 differ in size, as shown in FIG. 6(A), the sensitivity change becomes very small as illustrated by curve P of FIG. 6(B). As can be appreciated, in FIG. 6(B), the abscissa expresses the amount of deviation (Xmm) between the edges of the two iron vanes with "X=0" corresponding to where the iron vanes are centered. Of course, moving iron vane 15 may be made larger than fixed iron vane 25.

Figure 1:
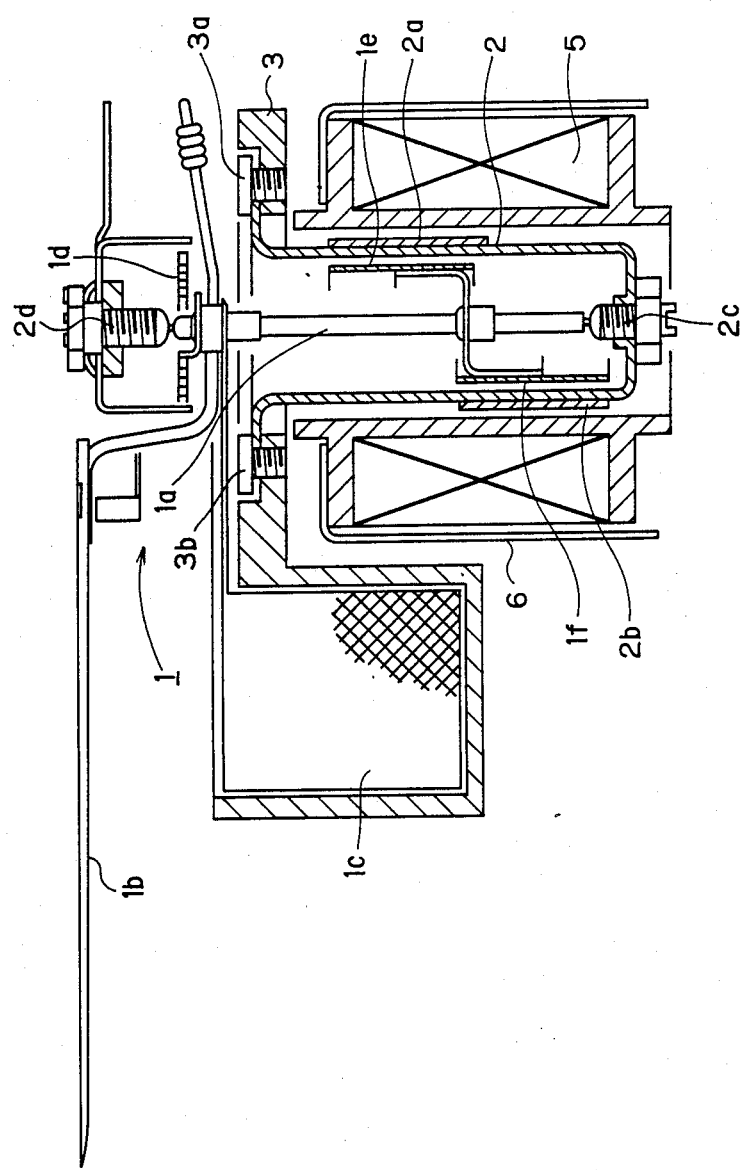
FIG. 1 is a structural diagram depicting important portions of a conventional moving-iron instrument.
Figure 2:
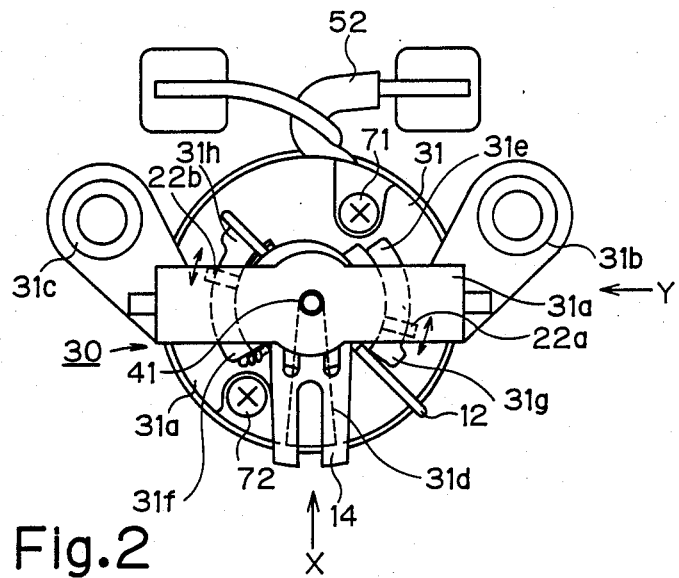
FIGS. 2(A), 2(B) and 2(C) are structural diagrams depicting an illustrative embodiment of the invention.
Figure 2:
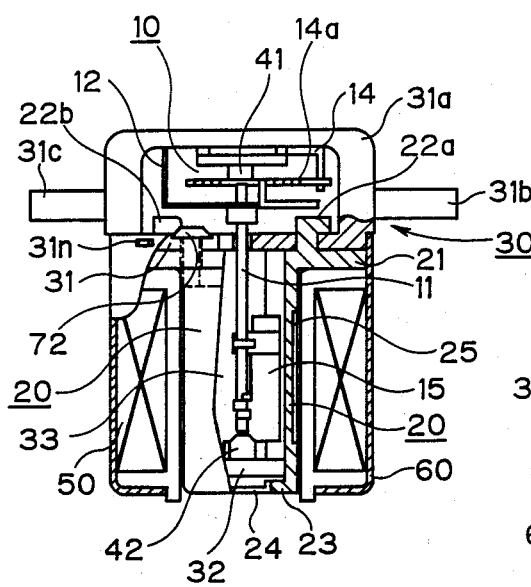
Figure 2:
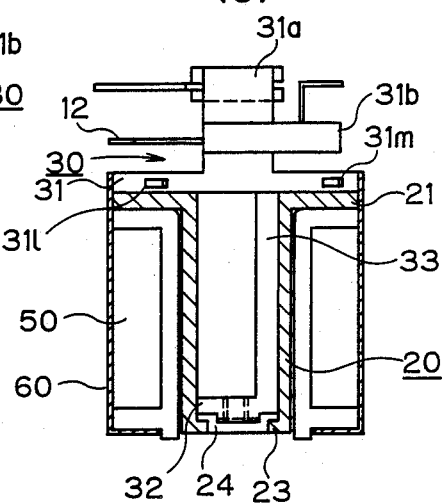
Figure 7:
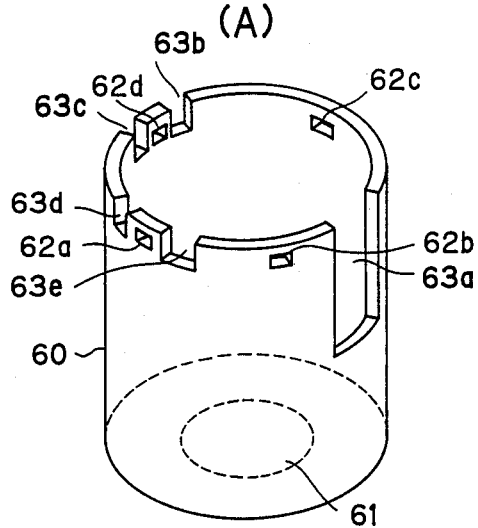
FIGS. 7(A) and 7(B) are structural diagrams depicting a shield casing portion usable in the invention.
Figure 7:
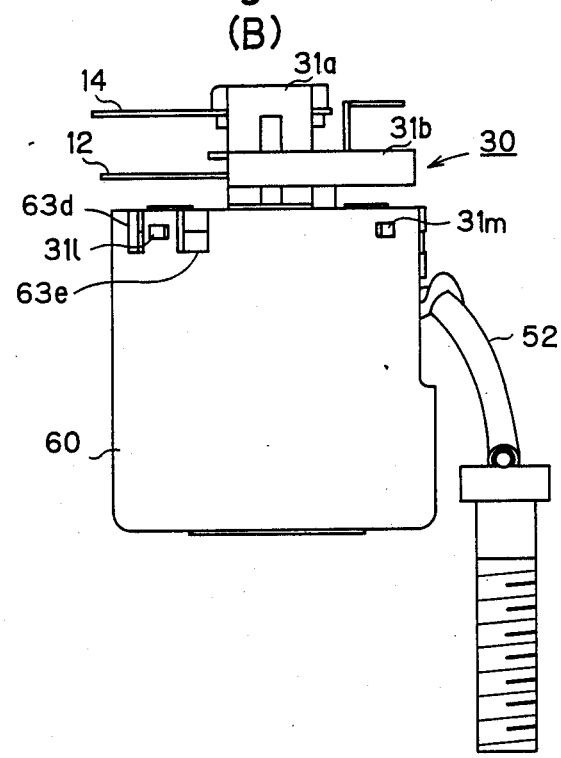

Shield member 60, shown in FIG. 2, is a bottom member of cylindrical shape as shown in FIG. 7(A), which has a hole 61 formed in a bottom portion thereof. An opening portion of shield member 60 has four holes 62a-62d which are fitted with four projections 31l-31p (see FIG. 7(B) wherein 31p is not shown) provided on the circumferential surface of disk 31. Notches 63a-63e are formed in an open portion, as depicted. Shield member 60 is pressed in from the bottom side of field coil 50. After member 60 finally reaches the fitted state, projections 31l-31p are snap fitted in holes 62a-62d. As a result, the components are assembled together as shown in FIG. 7(B). According to the invention shield casing 60 is attached by snap fitting. Thus, shield casing 60 is easily attached and detached. Moreover, the usual attaching parts are not required. Thus, the invention is produced at low cost.

The foregoing description is illustrative of the principles of the invention. Numerous modifications and extensions thereof would be apparent to the worker skilled in the art. All such modifications and extensions are to be considered to be within the spirit and scope of the invention.

What is claimed is:
1. A moving iron instrument comprising
a cylinder;
a fixed iron vane;
a moving iron vane;
a moving shaft having said moving iron vane attached thereto and disposed inside said cylinder having said fixed iron vane; wherein
said cylinder comprises
a cylinder member made of an insulating material and to which said fixed iron vane is attached, and
a frame member made of an insulating material and to which said moving shaft is held, said frame member being movably fitted within said cylinder member, whereby adjustment of the relative position between the moving iron vane and the fixed iron vane is achieved by rotating the cylinder member relative to the frame member.

2. The instrument of claim 1, wherein said insulating material is plastic.

3. The instrument of claim 1, wherein said moving iron vane comprises a pair of attaching arms extending from two edges thereof, the distal ends of said attaching arms having respective curved portions, said moving iron vane also being attached to said moving shaft by inserting said moving shaft in said curved portions.

4. The instrument of claim 1, wherein said moving iron vane and said fixed iron vane differ in size from each other.

5. The instrument of claim 1, further comprising a field coil, and a shield casing for surrounding said field coil, said field coil producing magnetic fields for exciting said moving iron vane and said fixed iron vane, said shield casing being attached to said frame member by snap fitting.

6. The instrument of claim 1, wherein said cylinder member comprises an elongated hollow cylindrical base portion and a disk shaped top portion; and said frame member comprises a cylindrical bottom part fitted into the hollow of said cylindrical base portion, a top part aligned with said disk shaped portion and an intermediate stem part connecting said cylindrical bottom part and said top part.

7. The instrument of claim 6, wherein said disk shaped top portion has at least one projection portion on a top surface thereof, and wherein said top part of said frame member has at least one hole therein so that when the top portion and the top part are aligned the projection portion is fitted within said hole, so that by manual movement of said projection portion the relative position of the cylinder member and the frame member is adjusted.

8. A moving iron instrument comprising
a moving section comprising a moving shaft having pivots at both ends thereof, a pointer secured to said moving shaft, and a moving iron vane attached to said moving shaft;
a frame member made of plastic, comprising a member having a bridge to which an upper jeweled screw is attached, a member to which a lower jeweled screw is attached, and a stem portion for connecting said two members, wherein said moving section is held to be rotatable between said upper and said lower jeweled screws;
a cylinder member made of plastic and formed as a cylindrical body, wherein a fixed iron vane different in size from said moving iron vane is attached to an outer side of the cylindrical body, said lower jeweled screw being inserted to be rotatable within a cylindrical space of said cylinder member so that said fixed iron vane faces toward said moving iron vane;
a cylindrical field coil covered with a shield, wherein said cylinder member is insulated within a cylindrical space thereof; and
means for guiding which allow said cylinder member to rotate with respect to said frame member such that the relative position of said moving iron vane and said fixed iron vane is changed thereby adjusting the sensitivity of said instrument.

9. The instrument of claim 8, wherein said moving iron vane comprises a pair of attaching arms extending toward an inner central portion from two edges thereof, the distal ends of said attaching arms having respective curved portions, said moving iron vane also being attached to said moving shaft by inserting said moving shaft in said curved portions.

10. The instrument of claim 8, wherein said frame member is formed by molding, and said cylinder member is formed by molding.

* * * * *

UNITED STATES PATENT AND TRADEMARK OFFICE
CERTIFICATE OF CORRECTION

PATENT NO. : 4,912,398
DATED : MARCH 27, 1990
INVENTOR(S) : YUJI KAWAI

It is certified that error appears in the above—identified patent and that said Letters Patent is hereby corrected as shown below:

TITLE PAGE. ASSIGNEE IS --YOKOGAWA ELECTRIC CORPORATION

TOKYO, JAPAN --

Signed and Sealed this

Ninth Day of April, 1991

*Attest:*

HARRY F. MANBECK, JR.

*Attesting Officer*     *Commissioner of Patents and Trademarks*